US010635765B2

United States Patent
Natsumeda

(10) Patent No.: US 10,635,765 B2
(45) Date of Patent: *Apr. 28, 2020

(54) CLUSTER DRAWING ON DIVIDED DISPLAY REGION ALLOCATED TO CLUSTER

(71) Applicant: NEC Corporation, Minato-ku, Tokyo (JP)

(72) Inventor: Masanao Natsumeda, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/400,116

(22) Filed: May 1, 2019

(65) Prior Publication Data

US 2019/0258761 A1    Aug. 22, 2019

Related U.S. Application Data

(63) Continuation of application No. 14/771,077, filed as application No. PCT/JP2014/001289 on Mar. 7, 2014, now Pat. No. 10,311,172.

(30) Foreign Application Priority Data

Mar. 13, 2013    (JP) .................................. 2013-050629

(51) Int. Cl.
*G06F 17/50*    (2006.01)
*G05B 23/02*    (2006.01)
(Continued)

(52) U.S. Cl.
CPC ..... *G06F 17/5009* (2013.01); *G05B 23/0254* (2013.01); *G05B 23/0272* (2013.01);
(Continued)

(58) Field of Classification Search
CPC .................................................. G06F 17/5009
(Continued)

(56) References Cited

U.S. PATENT DOCUMENTS 10,311,172 B2 *    6/2019    Natsumeda ......... G06F 17/5009
2005/0197805 A1    9/2005    Eryurek et al.
(Continued)

FOREIGN PATENT DOCUMENTS

EP    2523115 A1    11/2012
JP    2003271652 A    9/2003
(Continued)

OTHER PUBLICATIONS

International Search Report for PCT Application No. PCT/JP2014/001289, dated Apr. 8, 2014, 3 pp.
(Continued)

*Primary Examiner* — Hugh M Jones
*Assistant Examiner* — Robert S Brock

(57) ABSTRACT

Clusters of metrics in a system are stored. A display region is divided into n divided regions in such a way that an area of a divided region i ($1 \le i \le n$) is equal to or larger than an area of a divided region i+1. Each cluster is allocated to the divided region i sequentially selected from i=1, in the decreasing order of the number of metrics contained in each of the clusters, in such a way that the number of the clusters allocated to the divided region i+1 is equal to or more than the number of clusters allocated to the divided region i. The cluster allocated to the divided region i is drawn in the divided region i.

19 Claims, 9 Drawing Sheets

(51) Int. Cl.
  *G06F 11/32* (2006.01)
  *G06F 11/34* (2006.01)
(52) U.S. Cl.
  CPC .............. *G05B 2219/31455* (2013.01); *G05B 2219/31477* (2013.01); *G06F 11/323* (2013.01); *G06F 11/3452* (2013.01)
(58) Field of Classification Search
  USPC .......................................................... 703/13
  See application file for complete search history.

(56) References Cited

U.S. PATENT DOCUMENTS

| | | |
|---|---|---|
| 2009/0089421 A1 | 4/2009 | Boehm et al. |
| 2009/0204368 A1 | 8/2009 | Bickel |
| 2012/0131388 A1 | 5/2012 | Snooke |

FOREIGN PATENT DOCUMENTS

| | | |
|---|---|---|
| JP | 4872944 B2 | 9/2009 |
| WO | 2011083687 A1 | 7/2011 |

OTHER PUBLICATIONS

English translation of Written opinion for PCT Application No. PCT/JP2014/001289, 1 pg.
Toru Moriyama, Ijo o Minuku 'Invariant Bunseki', Nikkei Computer, Jan. 24, 2013 (Jan. 24, 2013), No. 82 6, pp. 110 to 111.
Extended European Search Report for EP Application No. EP14765305.9 dated Dec. 5, 2016, 8 pp.

* cited by examiner

Fig. 4

| CLUSTER | NUMBER OF METRICS | INDEX |
|---|---|---|
| C1 | 120 | 1 |
| C2 | 8 | 2 |
| C3 | 7 | 3 |
| C4 | 4 | 4 |
| C5 | 4 | |
| C6 | 3 | 5 |
| C7 | 3 | |
| C8 | 3 | |
| C9 | 2 | 6 |
| C10 | 2 | |
| C11 | 2 | |
| C12 | 2 | |
| C13 | 2 | |
| C14 | 2 | |
| C15 | 2 | |
| C16 | 2 | |
| C17 | 2 | |
| C18 | 2 | |
| C19 | 2 | |
| C20 | 2 | |
| C21 | 2 | |

CLUSTER DRAWING ON DIVIDED DISPLAY REGION ALLOCATED TO CLUSTER

The present application is a Continuation application of Ser. No. 14/771,077 filed on Aug. 27, 2015, which is a National Stage Entry of PCT/JP2014/001289 filed on Mar. 7, 2014, which claims priority from Japanese Patent Application 2013-050629 filed on Mar. 13, 2013, the contents of all of which are incorporated herein by reference, in their entirety.

TECHNICAL FIELD

The present invention relates to a system analysis device and a system analysis method.

BACKGROUND ART

An example of an operation management system which models a system by using time-series information about system performance and determines a cause of failure, abnormality and the like of the system by using a generated model is described in PTL 1.

The operation management system described in PTL1 generates a correlation model of a system by determining correlation functions expressing correlations between each pair of a plurality of metrics (performance indexes) on the basis of measurements of the plurality of metrics measured by a plurality of sensors or the like of the system. Then, the operation management system detects destruction of correlations (correlation destruction) by using the generated correlation model to determine a failure cause of the system on the basis of the correlation destruction. This technology for analyzing a state of a system on the basis of correlation destruction is called invariant relation analysis.

In the invariant relation analysis in PTL1, a correlation diagram expressing correlations between metrics in the generated correlation model is drawn on a display region of a display device, and output to an administrator or the like. Then, a correlation for which correlation destruction is detected, and a metric as a candidate for a failure cause are illustrated on the correlation diagram.

FIG. 10 is a diagram illustrating an example of the correlation diagram used in the invariant relation analysis. In FIG. 10, respective nodes indicate metrics, while lines between the metrics indicate correlations. The correction diagram is divided into clusters which are metric groups obtained by tracking the correlations, in other words, metric groups having correlations, and drawn.

As a method for drawing the correlation diagram divided into clusters, for example, a method which determines areas to be allocated to respective clusters on a display region in proportion to the numbers of metrics (sizes of clusters) contained in the respective clusters to divide the display region, is considered.

As a related technology, a technology which allocates images on a display region by setting the display size of an image group exhibiting the i-th highest similarity to an integer multiple of the display size of an image group exhibiting the (i+1)th highest similarity, in a similar image retrieval device, is disclosed in PTL2.

CITATION LIST

Patent Literature

[PLT1] Japanese Patent Publication No. 4872944
[PLT2] Japanese Patent Application Laid-Open Publication No. 2003-271652

SUMMARY OF INVENTION

Technical Problem

In a large-scale system or the like configured by a large number of devices (components), there is a following tendency in distribution of the number of clusters in view of the number of metrics contained in each of the clusters. In the large-scale system or the like, in general, the number of clusters each containing an extremely large number of metrics (extremely large clusters) is small, while the number of clusters each containing an extremely small number of metrics (extremely small clusters) is large. In other words, there exist both a small number of clusters each containing an extremely large number of metrics, and a large number of clusters each containing an extremely small number of metrics.

This is because the system includes both metrics correlated to the entire system and metrics correlated to only a part of the system.

The system is provided for the purpose of performing a certain function, wherefore correlations are basically established between respective devices throughout the system, and a large number of metrics associated with the respective devices are linked with each other. As a result, clusters each containing an extremely large number of metrics are produced in the correlation model.

On the other hand, there exist metrics correlated within limited devices, but not linked with metrics throughout the system, such as metrics associated with setting values of respective devices. The number of metrics of this type is extremely small as viewed from the entire system. Accordingly, clusters each containing an extremely small number of metrics are also produced in the correlation model.

In an actual system, the number of functions provided by the entire system is not large so that the number of clusters each containing an extremely large number of metrics is small. On the other hand, the actual system is configured by a large number of devices so that the number of clusters each containing an extremely small number of metrics is large.

In a case of a power plant, for example, the function provided by the entire system is power generation, wherefore amounts of power generation, amounts of circulating water, temperatures of power generation units, loads on respective devices, and the like are linked with the behaviors of the power generation. Accordingly, clusters containing a large number of metrics are produced in association with the power generation. On the other hand, setting values peculiar to the respective devices are not greatly correlated with the amounts of the power generation, but are strongly correlated with each other within the respective devices. Accordingly, a large number of clusters each containing a small number of metrics associated with setting values are produced.

When an area allocated to each of clusters is determined in proportion to the number of metrics (size of cluster) contained in the corresponding cluster for drawing a correlation diagram of the large-scale system described above, the area of each cluster containing an extremely large number of metrics considerably increases. Further, the area of each cluster containing an extremely small number of metrics considerably decreases. In this case, size differences between respective clusters cannot be overviewed, and then visibility of the correlation diagram deteriorates.

For example, when one cluster containing about 1,000 metrics, and ten clusters each containing about 10 metrics are produced, the area allocated to each of the clusters each containing about 10 metrics occupies only about 1% of the display screen.

When the technology in PTL2 is applied for drawing the correlation diagram of such a large-scale system, the total area allocated to the image groups described above is affected by distribution of the number of clusters in view of the number of contained metrics. For this reason, the total area of the clusters each containing an extremely large number of metrics may considerably decrease, while the total area of the clusters each containing an extremely small number of metrics may considerably increase. In this case, similarly to the above case, size differences between the clusters cannot be overviewed, and then visibility of the correlation diagram deteriorates.

An object of the present invention is to solve the aforementioned problems, and to provide a system analysis device and a system analysis method, which are capable of obtaining a correlation diagram with improved visibility in invariant relation analysis.

Solution to Problem

A system analysis device according to an exemplary aspect of the invention includes: a correlation model storage means for storing a correlation model expressing correlations between metrics in a system; and a display control means for dividing a display region into n divided regions in such a way that an area of a divided region i ($1 \leq i \leq n$) is equal to or larger than an area of a divided region i+1, allocating each cluster of a plurality of clusters obtained by tracking the correlations in the correlation model to the divided region i sequentially selected from i=1, in the decreasing order of the number of metrics contained in each of the clusters, in such a way that the allocated number of the clusters increases in accordance with increase in i, and drawing the cluster allocated to the divided region i in the divided region i.

A system analysis method according to an exemplary aspect of the invention includes: storing a correlation model expressing correlations between metrics in a system; and dividing a display region into n divided regions in such a way that an area of a divided region i ($1 \leq i \leq n$) is equal to or larger than an area of a divided region i+1, allocating each cluster of a plurality of clusters obtained by tracking the correlations in the correlation model to the divided region i sequentially selected from i=1, in the decreasing order of the number of metrics contained in each of the clusters, in such a way that the allocated number of the clusters increases in accordance with increase in i, and drawing the cluster allocated to the divided region i in the divided region i.

A computer readable storage medium according to an exemplary aspect of the invention records thereon a program, causing a computer to perform a method including: storing a correlation model expressing correlations between metrics in a system; and dividing a display region into n divided regions in such a way that an area of a divided region i ($1 \leq i \leq n$) is equal to or larger than an area of a divided region i+1, allocating each cluster of a plurality of clusters obtained by tracking the correlations in the correlation model to the divided region i sequentially selected from i=1, in the decreasing order of the number of metrics contained in each of the clusters, in such a way that the allocated number of the clusters increases in accordance with increase in i, and drawing the cluster allocated to the divided region i in the divided region i.

Advantageous Effects of Invention

An advantageous effect of the present invention is that it is possible to obtain a correlation diagram with improved visibility in invariant relation analysis.

BRIEF DESCRIPTION OF DRAWINGS

FIG. 4 is a diagram illustrating number of metrics contained in respective clusters in a correlation model 122 according to the exemplary embodiment of the present invention.

DESCRIPTION OF EMBODIMENTS

An exemplary embodiment according to the present invention is described.

It is assumed herein that, a correlation model 122 generated for a system exhibits distribution having a small number of clusters for an extremely large number of metrics, and a large number of clusters for an extremely small number of metrics, similarly to the cases described above.

Figure 2:
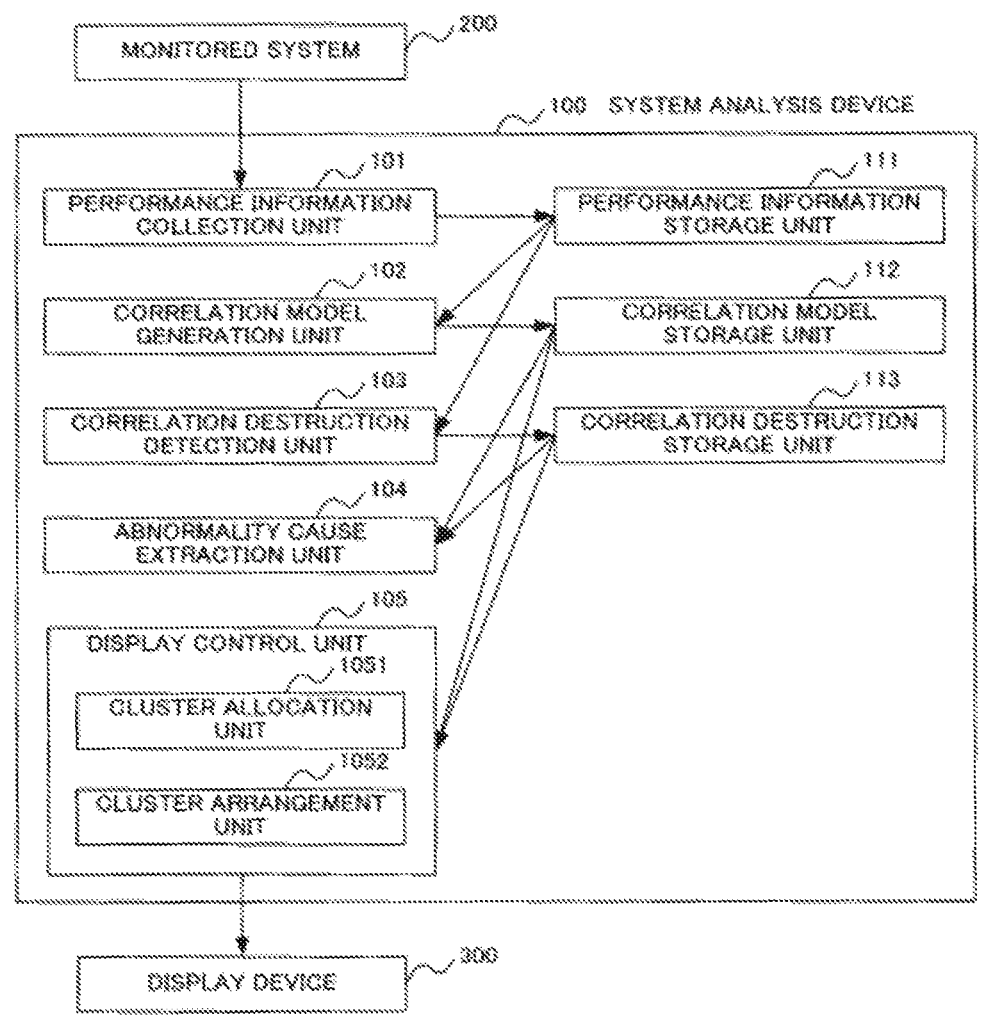
FIG. 2 is a block diagram illustrating a configuration of a system analysis device 100 according to the exemplary embodiment of the present invention.

First, a configuration according to the exemplary embodiment of the present invention is described. FIG. 2 is a block diagram illustrating a configuration of a system analysis device 100 according to the exemplary embodiment of the present invention.

Referring to FIG. 2, the system analysis device 100 according to the exemplary embodiment of the present invention is connected with a monitored system 200, and a display device 300.

The system analysis device 100 generates a correlation model 122 of the monitored system 200 on the basis of performance information collected from the monitored system 200, and analyzes a state of the monitored system 200 on the basis of correlation destruction detected by using the generated correlation model 122.

The monitored system 200 is, for example, a system for which invariant relation analysis is performed, such as an IT (Information Technology) system, a plant system, a structure, transportation equipment. The monitored system 200 obtains measurement data (measurements) of a plurality of metrics (performance indexes) measured on the system at regular time intervals, and transmits the obtained data to the system analysis device 100. When the monitored system 200 is an IT system, metrics to be used are use rates, use volumes of computer resources and network resources, setting values and the like of respective devices equipped on the system. For example, CPU (Central Processing Unit) use rates, memory use rates, disk access frequencies and the like are used as metrics. When the monitored system 200 is a plant system, a structure, or transportation equipment, metrics to be used are measurements of various types of sensors provided on the respective units of the system, setting values of the respective units, or the like. Each metric corresponds to an "element" for which a correlation model is generated in PTL1.

The display device 300 is a device such as an LCD (Liquid Crystal Display) and a CRT (Cathode Ray Tube), and displays a correlation diagram for the correlation model 122 generated by the system analysis device 100.

The system analysis device 100 includes a performance information collection unit 101, a correlation model generation unit 102, a correlation destruction detection unit 103, an abnormality cause extraction unit 104, a display control unit 105, a performance information storage unit 111, a correlation model storage unit 112, and a correlation destruction storage unit 113.

The performance information collection unit 101 collects performance information from the monitored system 200.

The performance information storage unit 111 stores a time-series change of the performance information collected by the performance information collection unit 101 as performance series information.

The correlation model generation unit 102 generates the correlation model 122 of the monitored system 200 on the basis of the performance series information.

In this case, the correlation model 122 includes correlation functions each expressing correlations of respective pairs of metrics. Each of the correlation functions is a function for predicting one of values of a pair of metrics based on time series of both of the pair, or time series of the other of the pair. The correlation model generation unit 102 determines a correlation function by system identification processing executed for performance information in a predetermined modeling period, similarly to the operation management device in PTL1. The correlation model generation unit 102 may use a set of correlation functions exhibiting a predetermined value or higher of prediction accuracy as the correlation model 122.

The correlation model storage unit 112 stores the correlation model 122 generated by the correlation model generation unit 102.

The correlation destruction detection unit 103 detects correlation destruction in a correlation in the correlation model 122 for newly input performance information.

The correlation destruction detection unit 103 detects correlation destruction for respective pairs of metrics similarly to the operation management device in PTL1. The correlation destruction detection unit 103 detects correlation destruction of a correlation for a pair when a difference (prediction error) between a measurement of a metric and a prediction value of the metric obtained by input of a measurement of a metric into a correlation function is equal to or greater than a predetermined threshold.

The correlation destruction storage unit 113 stores correlation destruction information indicating a correlation for which correlation destruction is detected.

The abnormality cause extraction unit 104 extracts a candidate for a metric (abnormality cause metric) in which an abnormality occurs on the basis of the correlation destruction information. The abnormality cause extraction unit 104 extracts a candidate for the abnormality cause metric on the basis of the number or ratio of correlation destruction for each metric, similarly to the operation management device in PTL1, for example.

The display control unit 105 creates a correlation diagram to be displayed on the display device 300 on the basis of the correlation model 122. The display control unit 105 includes a cluster allocation unit 1051, and a cluster arrangement unit 1052.

The cluster allocation unit 1051 divides a display region of the display device 300 into a predetermined number of divided regions, and allocates clusters contained in the correlation model 122 to the respective divided regions. The cluster allocation unit 1051 allocates the plurality of clusters in the correlation model 122 to the divided regions selected in the decreasing order of the area size from the predetermined number of divided regions, in the decreasing order of the number of metrics, in such a way that the allocated number of the clusters increases in accordance with decrease in the area size.

The cluster arrangement unit 1052 creates the correlation diagram by drawing a graph illustrating correlations between metrics contained in each of the clusters allocated to the respective divided regions.

The system analysis device 100 may be configured by a computer which includes a CPU and a storage medium storing a program, and operates under control of the program. The performance information storage unit 111, the correlation model storage unit 112, the correlation destruction storage unit 113, and the detection sensitivity storage unit 114 may be either separate storage mediums for each, or configured by a one-piece storage medium.

Next, an operation of the system analysis device 100 according to the exemplary embodiment of the present invention is described.

Figure 3:
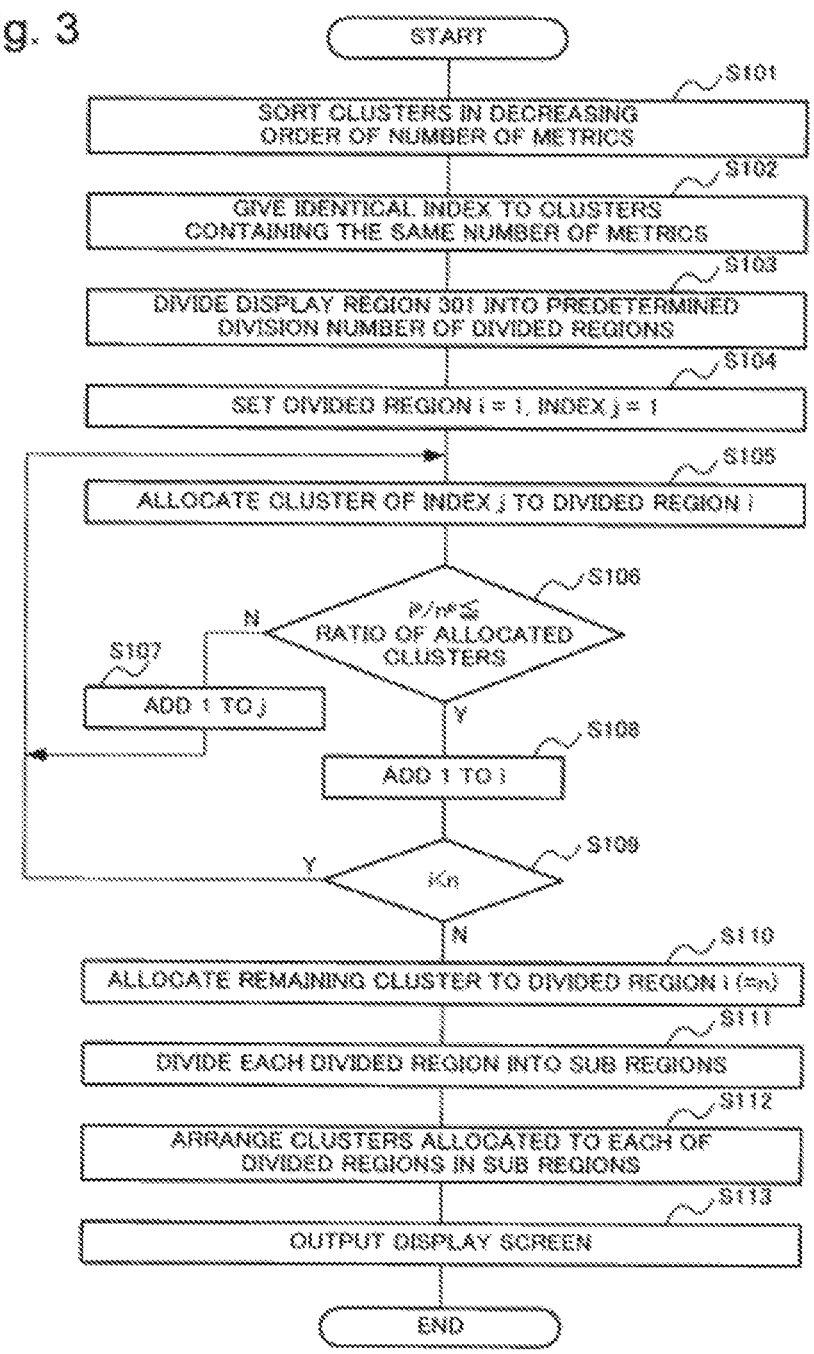
FIG. 3 is a flowchart illustrating an operation of the system analysis device 100 according to the exemplary embodiment of the present invention.

FIG. 3 is a flowchart illustrating an operation of the system analysis device 100 according to the exemplary embodiment of the present invention.

The cluster allocation unit 1051 of the display control unit 105 sorts clusters in the correlation model 122 in the decreasing order of the number of metrics (step S101). Here, the cluster allocation unit 1051 gives identifiers to the respective clusters in the decreasing order of the number of contained metrics.

FIG. 4 is a diagram illustrating the number of metrics of the respective clusters in the correlation model 122 according to the exemplary embodiment of the present invention. For example, the cluster allocation unit 1051 gives identifiers C1 through C21 to 21 clusters in the correlation model 122, respectively, in the decreasing order of the number of metrics, as illustrated in FIG. 4.

Further, the cluster allocation unit 1051 further sets indexes for the different numbers of metrics, in the decreasing order of the number of metrics. Then, the cluster allocation unit 1051 gives, to the clusters each containing the same number of metrics, an identical index set for the number of metrics (step S102).

For example, the cluster allocation unit 1051 gives indexes 1 through 6 to the clusters C1 through C21, as illustrated in FIG. 4.

Next, the cluster allocation unit 1051 divides a display region 301 of the display device 300 into a predetermined division number of divided regions (step S103). Here, the cluster allocation unit 1051 gives identifiers starting from 1 to the divided regions in the decreasing order of the area size. The cluster allocation unit 1051 arranges the divided regions in the decreasing order of the area size on the display region 301.

Figure 5:
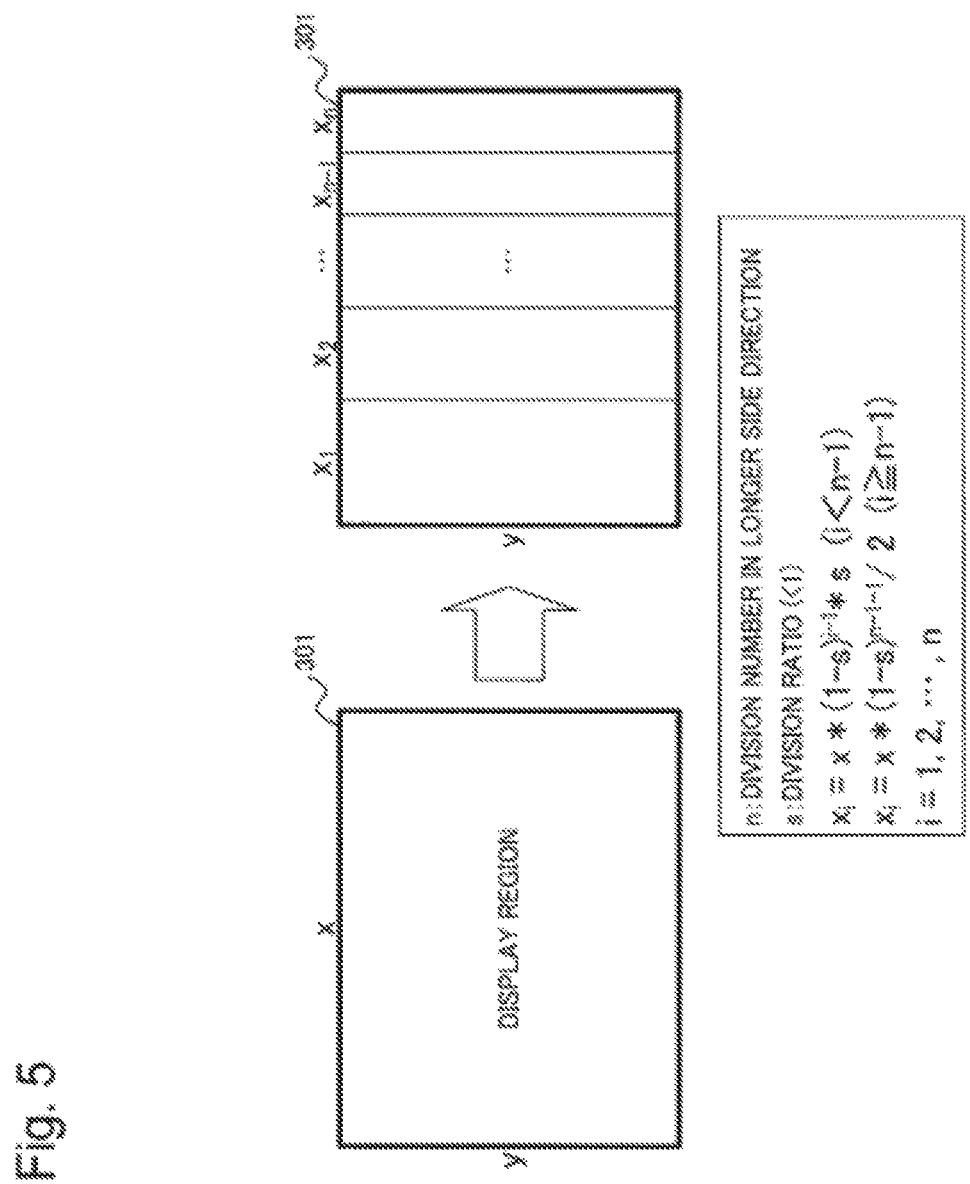
FIG. 5 is a diagram illustrating a method for dividing a display region 301 according to the exemplary embodiment of the present invention.

FIG. 5 is a diagram illustrating a method for dividing the display region 301 according to the exemplary embodiment of the present invention.

In the exemplary embodiment of the present invention, the display region 301 has a rectangular shape, and a length x in the longer side direction of the rectangular shape is divided based on an equation defined for a predetermined division number n and a predetermined division ratio s, as illustrated in FIG. 5. The divided regions are arranged in the longer side direction in the decreasing order of the area size.

Figure 6:
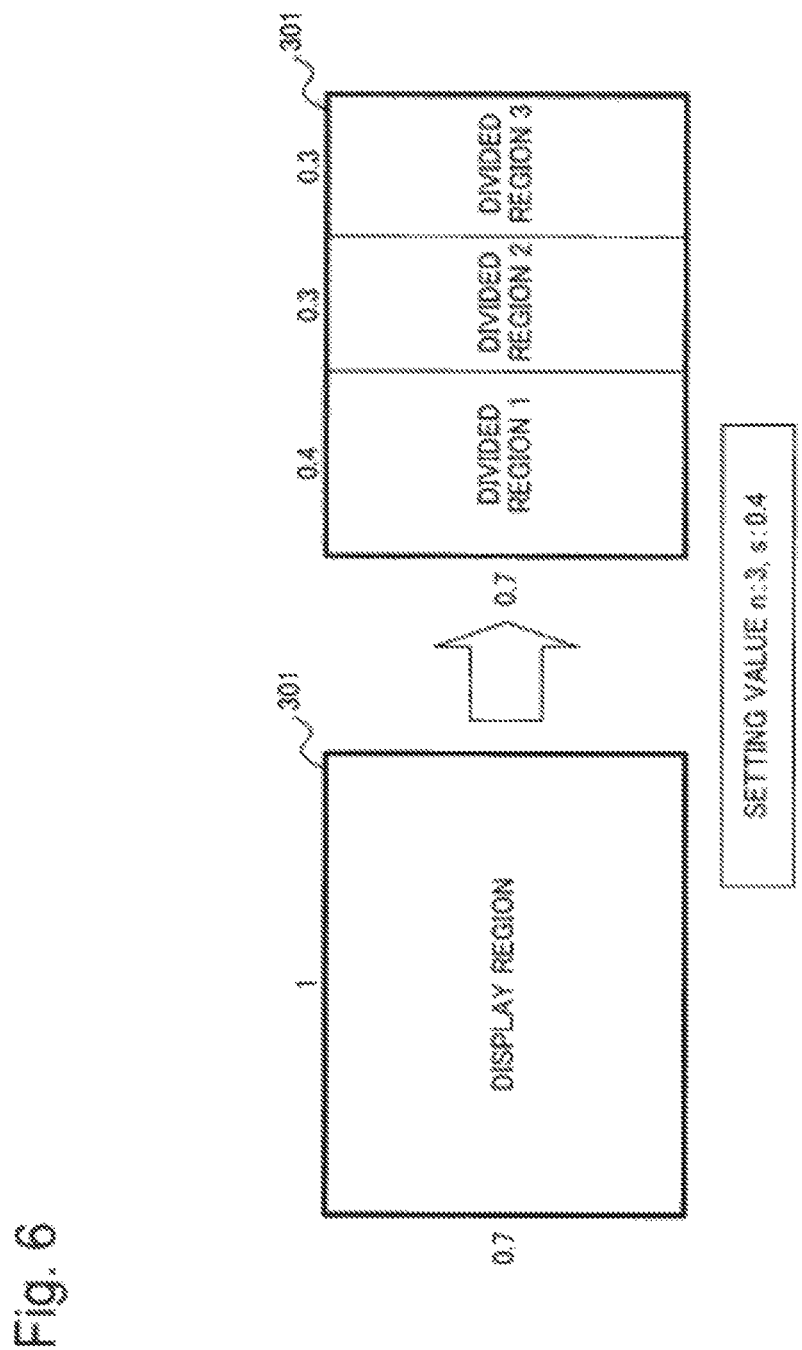
FIG. 6 is a diagram illustrating an example of division of the display region 301 into divided regions according to the exemplary embodiment of the present invention.

FIG. 6 is a diagram illustrating an example of division of the display region 301 into divided regions according to the exemplary embodiment of the present invention. When the division number n and the division ratio s are 3 and 0.4, respectively, for example, the cluster allocation unit 1051 divides the longer side of the display region 301 into three divided regions at ratios of 0.4, 0.3, and 0.3, and gives identifiers 1 through 3 to the divided regions in the decreasing order of the area size.

Next, the cluster allocation unit 1051 sets 1 to i indicating an identifier of the divided region, and 1 to j indicating the index (step S104).

The cluster allocation unit 1051 allocates a cluster to which the index j is given to the divided region i (step S105).

When Equation 1 (Math 1) is not satisfied for the ratio of the number of allocated clusters (step S106/N), the cluster allocation unit 1051 adds 1 to j (step S107), and repeats the processing from step S105.

$$i^p/n^p \leq \text{RATIO OF ALLOCATED CLUSTERS} \quad [\text{Math 1}]$$

In this Equation, p is a constant equal to or larger than 1 set by the administrator or the like. The "ratio of allocated clusters" refers to a ratio of the number of clusters allocated to the divided regions 1 through i to the total number of clusters.

When Equation 1 is satisfied (step S106/Y), the cluster allocation unit 1051 adds 1 to i (step S108), and repeats the processing from step S105 during a period of i<n (step S109).

The cluster allocation unit 1051 allocates the remaining cluster to the divided region i (=n) (step S110).

Figures 7, 8:
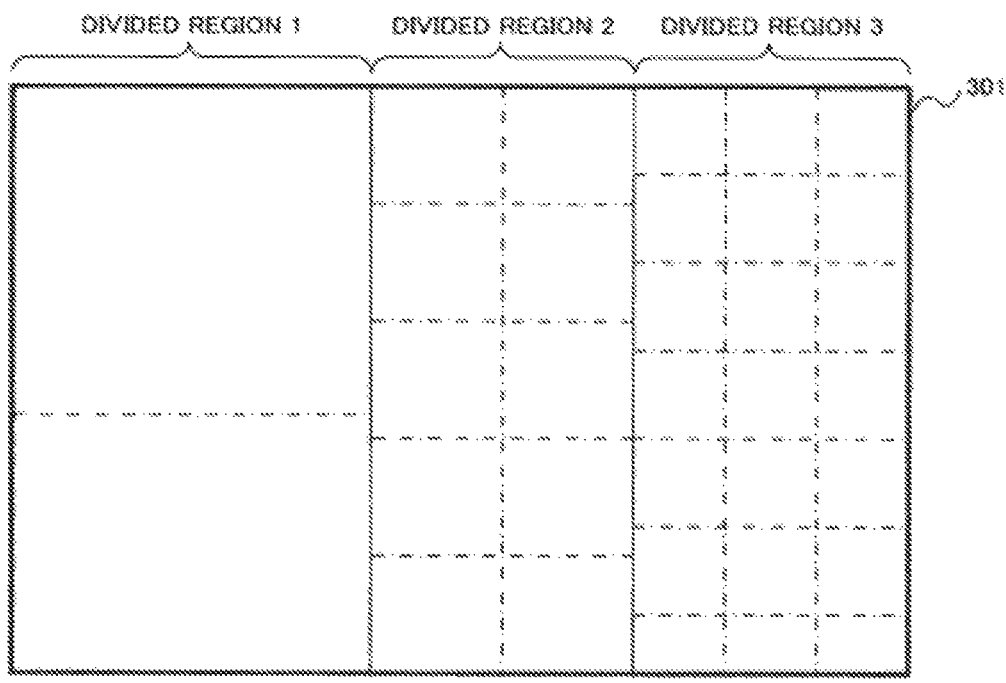
FIG. 7 is a diagram illustrating an example of allocation of clusters to the divided regions according to the exemplary embodiment of the present invention.
FIG. 8 is a diagram illustrating an example of division of the respective divided regions into sub regions according to the exemplary embodiment of the present invention.

FIG. 7 is a diagram illustrating an example of allocation of clusters to the divided regions according to the exemplary embodiment of the present invention. When p and n in Equation 1 are 2.8 and 3, respectively, for example, the cluster allocation unit 1051 allocates the one cluster C1, to which the index 1 is given, to the divided region 1 according to Equation 1, as illustrated in FIG. 7. Similarly, the cluster allocation unit 1051 allocates the seven clusters C2 through C8, to which the indexes 2 through 5 are given, to the divided region 2. Further, the cluster allocation unit 1051 allocates the thirteen clusters C9 through C21, to which the index 6 is given, to the divided region 3.

Next, the cluster arrangement unit 1052 divides each of the divided regions into sub regions based on the number of clusters allocated to the corresponding divided region (step S111).

FIG. 8 is a diagram illustrating an example of division of the respective divided regions into sub regions according to the exemplary embodiment of the present invention.

In the exemplary embodiment of the present invention, a square in a uniform size is used as sub regions, as illustrated in FIG. 8. The size of each square is determined such that the number of the squares is equal to or larger than the number of clusters allocated to the corresponding divided region, and that the area of each square is the largest.

Next, the cluster arrangement unit 1052 arranges the clusters allocated to each of the divided regions to the respective sub regions (step S112). Here, the cluster arrangement unit 1052 creates a correlation diagram by drawing graphs each indicating correlations between metrics contained in the cluster arranged in the sub region, in the corresponding sub regions. The cluster arrangement unit 1052 draws the graphs by using graph drawing algorism, such as KK (Kamada-Kawai) layout algorism, for example.

Figure 9:
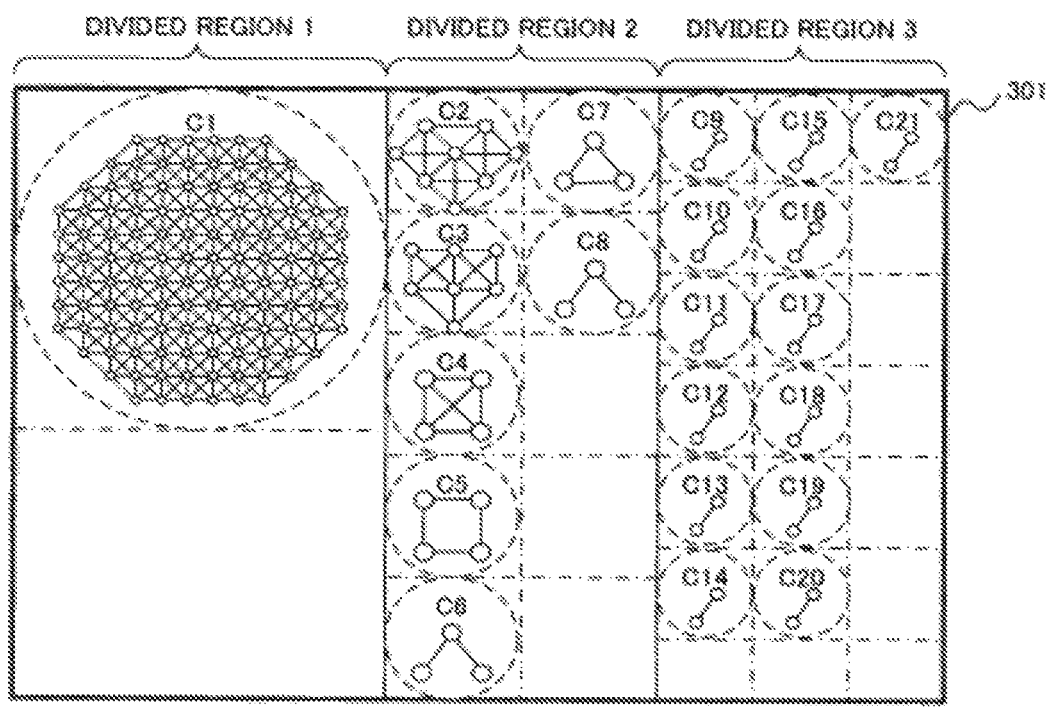
FIG. 9 is a diagram illustrating an example of arrangement of clusters in the display region 301 (correlation diagram) according to the exemplary embodiment of the present invention.
Figure 10:
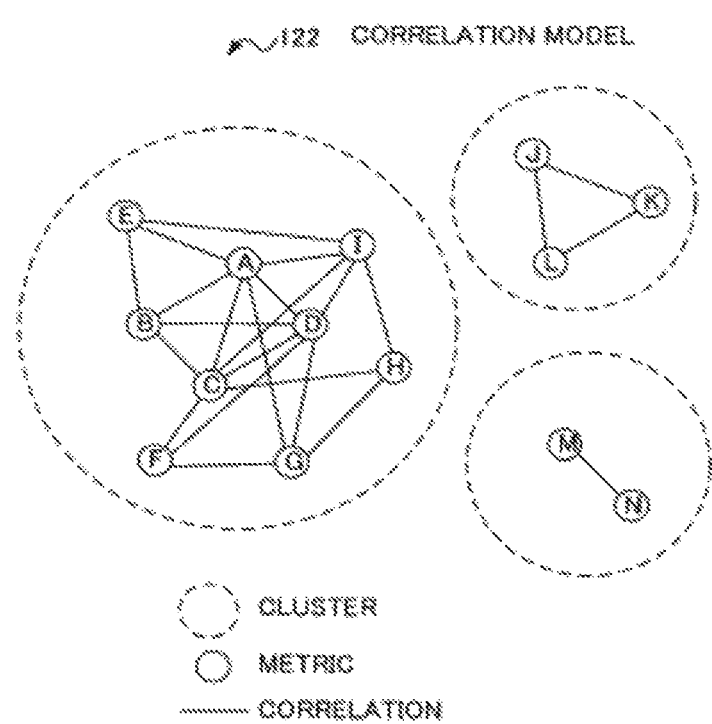
FIG. 10 is a diagram illustrating an example of a correlation diagram used in invariant relation analysis.

FIG. 9 is a diagram illustrating an example of arrangement of clusters in the display region 301 (correlation diagram) according to the exemplary embodiment of the present invention.

For example, the cluster arrangement unit 1052 arranges the cluster C1 in a sub region within the divided region 1, the clusters C2 through C8 in sub regions within the divided region 2, and the clusters C9 through C21 in sub regions within the divided region 3, respectively, as illustrated in FIG. 9.

The cluster arrangement unit 1052 outputs the correlation diagram created by arrangement of the clusters to the display device 300 (step S113). The display device 300 displays the correlation diagram to the administrator or the like.

For example, the cluster arrangement unit 1052 outputs the correlation diagram of FIG. 9 to the display device 300.

The operation according to the exemplary embodiment of the present invention is completed by the processing above described.

Note that, in the exemplary embodiment of the present invention, the specific example has been described, by citing the example in which the division ratio s and division number n of the display region 301 are 0.3 and 3, respectively, while the parameter p in Equation 1 for determining the ratios of the respective numbers of clusters to be allocated to the respective divided regions is 2.8. Appropriate values are selected as the division ratio s, division number n, and parameter p in correspondence with preference of the administrator or the like concerning the visibility, for example.

For example, when the division ratio s is close to 1, the area of each cluster containing a large number of metrics extremely increases (the area of each cluster containing a small number of metrics extremely decreases), and the visibility deteriorates. For obtaining high visibility for general use, it is preferable that the division ratio s is the smallest as possible value within a range of $1/3 < s < 1$. However, when emphasis of the cluster containing a large number of metrics is desired, the division ratio s may be a relatively large value within the range described above.

When the division number n is close to the number of clusters, the number of divided regions increases in accordance with increase in the number of clusters and the visibility deteriorates. For obtaining high visibility for general use, it is preferable that the division number n lies within a range of 1<n<<the number of clusters. For example, when both a small number of clusters each containing an extremely large number of metrics and a large number of clusters each containing an extremely small number of metrics are present, it is preferable that the division number n is set to 3. In this case, an approximately equivalent total area is allocated to each of a group of a small number of clusters each containing an extremely large number of metrics, a group of a large number of clusters each containing an extremely small number of metrics, and a group of middle-size clusters, by setting the smallest as possible value to the division ratio s, as described above. As a result, the respective cluster groups are overviewed with large, middle, and small ranks, such as a group of clusters each containing an extremely large number of metrics, a group of clusters each containing an extremely small number of metrics, and a group of middle-size clusters.

When the parameter p is extremely large, the number of clusters allocated to large divided regions considerably decreases (the number of clusters allocated to small divided regions considerably increases) so that the visibility deteriorates. Accordingly, for obtaining high visibility for general use, it is preferable that the parameter p is not an extremely large value, within a range $1 \leq p$. However, when emphasis of the cluster containing a large number of metrics is desired, the parameter p may be a relatively large number within the range described above.

As described above, in the exemplary embodiment of the present invention, the clusters are allocated to the regions divided beforehand. For this reason, even if distribution of the number of clusters in view of the number of metrics is excessively biased, the area of each cluster containing an extremely large number of metrics does not considerably increase, unlike the case when the area of each cluster is determined in proportion to the number of metrics. In addition, the area of each cluster containing an extremely small number of metrics does not considerably decrease.

In addition, in the exemplary embodiment of the present invention, the number of clusters allocated to each of the divided regions (image groups), and the total area allocated to the respective divided regions (image groups) are independently determined. For this reason, even if the distribution of the number of clusters in view of the number of metrics is excessively biased, the total area allocated to the respective divided regions (image groups) is not affected by distribution of the number of clusters, unlike the case when the technology in PTL2 is applied. In other words, the total area of the clusters each containing an extremely large number of metrics does not considerably decrease, and the total area of the clusters each containing an extremely small number of metrics does not considerably increase.

In addition, the clusters are allocated to the divided regions selected in the decreasing order of the area size from the predetermined number of divided regions, in the decreasing order of the number of metrics, in such a way that the allocated number increases in accordance with decrease in the area size. For this reason, the drawing area of each cluster containing a larger number of metrics is kept larger than the drawing area of each cluster containing a smaller number of metrics between the differently divided regions, such as between the divided region 1 and the divided region 2, or between the divided region 2 and the divided region 3, as illustrated in FIG. 9, for example.

In addition, each of the divided regions is divided into the sub regions so that the respective clusters are arranged in the corresponding sub regions. For this reason, the respective clusters are arranged so as not to be overlapped with each other.

Accordingly, size differences between the respective clusters throughout the system can be overviewed in the generated correlation diagram, wherefore the correlation diagram with high visibility can be obtained.

Figure 1:
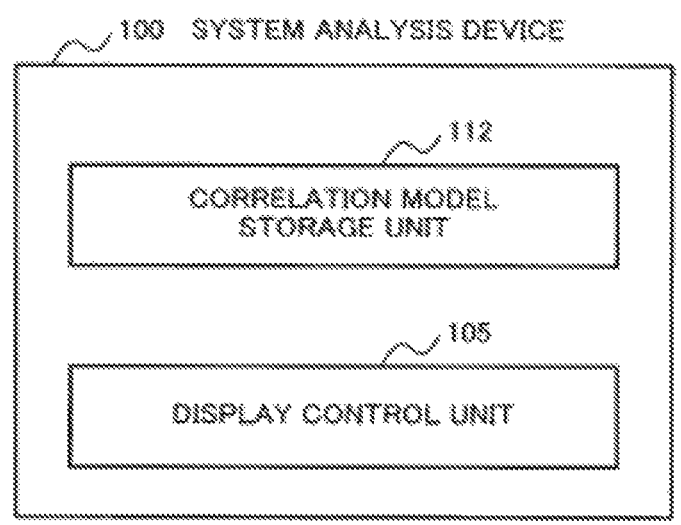
FIG. 1 is a block diagram illustrating a characteristic configuration according to an exemplary embodiment of the present invention.

Next, a characteristic configuration according to the exemplary embodiment of the present invention is described. FIG. 1 is a block diagram illustrating a characteristic configuration according to the exemplary embodiment of the present invention.

Referring to FIG. 1, the system analysis device 100 includes the correlation model storage unit 112, and the display control unit 105.

The correlation model storage unit 112 stores the correlation model 122 expressing correlations between metrics in the system.

The display control unit 105 divides the display region 301 into the n divided regions such that the area of the divided region i ($1 \leq i \leq n$) is equal to or larger than the area of the divided region i+1. The display control unit 105 allocates each of the plurality of clusters obtained by tracking correlations contained in the correlation model 122 to the divided region i sequentially selected from i=1, in the decreasing order of the number of metrics contained in each of the clusters, in such a way that the allocated number increases in accordance with increase in i. The display control unit 105 draws the cluster allocated to the respective divided region i in the divided region i.

According to the exemplary embodiment of the present invention, a correlation diagram with high visibility can be obtained in invariant relation analysis. This is because the display control unit 105 allocates a plurality of clusters to divided regions which is made by dividing the display region 301 in the following manner. The display control unit 105 divides the display region 301 into n divided regions such that the area of the divided region i ($1 \leq i \leq n$) is equal to or larger than the area of the divided region i+1. The display control unit 105 allocates each of a plurality of clusters obtained by tracking correlations in the correlation model 122 to the divided region i sequentially selected from i=1, in the decreasing order of the number of metrics contained in each of the clusters, in such a way that the allocated number increases in accordance with increase in i.

According to the exemplary embodiment of the present invention, a correlation diagram with high visibility can be obtained for general use, for the correlation models 122 of various types of systems exhibiting different distribution of the number of clusters and the number of metrics of the clusters. This is because the display control unit 105 allocates a plurality of clusters to divided regions in the manner described above, regardless of distribution of the number of clusters and the number of metrics of clusters.

When, for drawing a correlation diagram, the area allocated to each cluster is determined on the basis of distribution of the number of metrics contained in each cluster and the number of clusters, it has been difficult to reflect preference of the administrator or the like concerning visibility on the correlation diagram. According to the exemplary embodiment of the present invention, however, a correlation diagram reflecting preference or intention of the administrator or the like concerning visibility can be obtained. This is because the administrator or the like can adjust the division ratio s and division number n of the display region 301, and the parameter p for determining the ratios of the respective numbers of clusters to be allocated to the respective divided regions. Accordingly, it is possible to obtain a correlation diagram in which weights (degree of attention) of respective clusters are adjusted or ranks of respective clusters are given with sizes of the respective clusters, in correspondence with preference or intention of the administrator or the like.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

For example, in the exemplary embodiment of the present invention, the display control unit 105 creates a correlation diagram expressing correlations between metrics contained in clusters. However, not limited to the case, the display control unit 105 may further output other information in the form of information contained on the created correlation diagram. For example, the display control unit 105 may emphasize, on the correlation diagram, a correlation for which correlation destruction is detected by correlation destruction extraction unit 104, or a candidate for an abnormality cause metric extracted by the abnormality cause extraction unit 104.

In the exemplary embodiment of the present invention, the cluster allocation unit 1051 determines the number of clusters allocated to each of divided regions according to Equation 1. However, not limited to the case, the cluster allocation unit 1051 may determine the number of clusters by using functions other than Equation 1, or predetermined ratios set for the respective divided regions as long as the allocated number increases in accordance with decrease in the areas of the divided regions.

The cluster allocation unit 1051 may allocate at least one cluster to each of divided regions. In this case, the cluster allocation unit 1051 may adjust the division number of the display region 301 to a number equal to or smaller than the number of clusters when the number of clusters is smaller than the division number of the display region 301, for example. In addition, when there remains a divided region to which no cluster is allocated after step S110, the cluster allocation unit 1051 may adjust allocation of clusters by decreasing n or p, or decreasing both of n and p, or the like, so that at least one cluster can be arranged in each of the divided regions.

In the exemplary embodiment of the present invention, the cluster allocation unit 1051 allocates clusters such that clusters each containing the same number of metrics (clusters to each of which an identical index is given) are arranged in the same divided region. However, not limited to this case, the cluster allocation unit 1051 may allocate clusters not with reference to indexes, but in accordance with the ratio or number of clusters determined for each divided region in the decreasing order of the number of metrics.

In the exemplary embodiment of the present invention, the display region 301 is rectangular, and divided in the longer side direction of the display region 301, but the display region 301 may have shapes other than the rectangular shape, such as a concentric shape around a certain point, for example.

In the exemplary embodiment of the present invention, the respective divided regions are arranged in the longer side direction in the decreasing order of the area size, but the respective divided regions may be arranged in different manners. For example, when the display region 301 is divided into concentric regions around a certain point, the respective divided regions may be arranged from the center in the decreasing order of the area size.

According to the exemplary embodiment of the present invention, each of divided regions is divided into square sub regions, but each of the sub regions may have a shape other than the square shape as long as each divided region can be divided by the number of clusters allocated to the corresponding divided region.

This application is based upon and claims the benefit of priority from Japanese Patent Application No. 2013-050629, filed on Mar. 13, 2013, the disclosure of which is incorporated herein in its entirety by reference.

INDUSTRIAL APPLICABILITY

The present invention is applicable to invariant relation analysis for determining a cause of system abnormality or failure based on correlation destruction detected on a correlation model.

REFERENCE SIGNS LIST 100 system analysis device
101 performance information collection unit
102 correlation model generation unit
103 correlation destruction detection unit
104 abnormality cause extraction unit
105 display control unit
1051 cluster allocation unit
1052 cluster arrangement unit
111 performance information storage unit
112 correlation model storage unit
113 correlation destruction storage unit
122 correlation model
200 monitored system
300 display device
301 display region

The invention claimed is:

1. A system analysis method comprising:
storing, by a processor, a plurality of clusters of metrics respectively indicating performance of computer resources included in a system;
dividing, by the processor, a display region of a display device into n divided regions in such a way that an area of a divided region i ($1 \leq i \leq n$) is equal to or larger than an area of a divided region i+1;
allocating, by the processor, each cluster to the divided region i sequentially selected from i=1, in the decreasing order of the number of metrics contained in each of the clusters, in such a way that the number of the clusters allocated to the divided region i+1 is equal to or more than the number of clusters allocated to the divided region i;
drawing, by the processor, the cluster allocated to the divided region i in the divided region i of the display device; and
changing, by the processor, a configuration of the system to handle a failure relating to a metric of the system indicated in response to output of the divided region i on which the allocated cluster is drawn.

2. The system analysis method according to claim 1, wherein,
when allocating each cluster of the plurality of clusters, determining the number of clusters to be allocated to the divided region i by using an exponential function that has i as a base.

3. The system analysis method according to claim 1, wherein,
when drawing the cluster allocated to the divided region i, dividing the divided region i into sub regions of a number equivalent to the number of the clusters allocated to the divided region i, and draws clusters allocated to the divided region i in the corresponding sub regions respectively.

4. The system analysis method according to claim 1, wherein,
when drawing the cluster allocated to the divided region i, drawing a graph indicating a correlation between metrics contained in a cluster.

5. The system analysis method according to claim 1, wherein,
when dividing the display region, dividing the display region into the n divided regions in accordance with a predetermined division ratio.

6. The system analysis method according to claim 1, wherein,
when dividing the display region, arranging the divided region i of the n divided regions on the display region in the order of i.

7. The system analysis method according to claim 1, further comprising:
storing, by the processor, a correlation model expressing correlations between the metrics;
determining, by the processor, a candidate of an abnormality cause metric based on correlation destruction detected by using the correlation model and measured values of the metrics; and
emphasizing, by the processor, the candidate of the abnormality cause metric on the cluster.

8. The system analysis method according to claim 7, further comprising:
changing, by the processor, a configuration of the system to handle a failure relating to the abnormality cause metric of the system indicated in response to output of the display region.

9. The system analysis method according to claim 1, wherein
the metrics respectively indicate performances of computer resources in the system.

10. A system analysis device comprising:
a memory storing instructions, and
one or more processors configured to execute the instructions to:
store a plurality of clusters of metrics respectively indicating performance of computer resources included in a system,
divide a display region of a display device into n divided regions in such a way that an area of a divided region i ($1 \leq i \leq n$) is equal to or larger than an area of a divided region i+1,
allocate each cluster to the divided region i sequentially selected from i=1, in the decreasing order of the number of metrics contained in each of the clusters, in such a way that the number of the clusters allocated to the divided region i+1 is equal to or more than the number of clusters allocated to the divided region i,
draw the cluster allocated to the divided region i in the divided region i of the display device, and
change a configuration of the system to handle a failure relating to a metric of the system indicated in response to output of the divided region i on which the allocated cluster is drawn.

11. The system analysis device according to claim 10, wherein
the number of clusters to be allocated to the divided region i is determined by using an exponential function that has i as a base.

12. The system analysis device according to claim 10, wherein
the divided region i is divided into sub regions of a number equivalent to the number of the clusters allocated to the divided region i, and clusters allocated to the divided region i are drawn in the corresponding sub regions respectively.

13. The system analysis device according to claim 10, wherein
a graph indicating a correlation between metrics contained in a cluster is drawn.

14. The system analysis device according to claim 10, wherein
the display region is divided into the n divided regions in accordance with a predetermined division ratio.

15. The system analysis device according to claim 10, wherein
the divided region i of the n divided regions is arranged on the display region in the order of i.

16. The system analysis method according to claim 10, wherein
the one or more processors are configured to execute the instructions to:
store a correlation model expressing correlations between the metrics,
determine a candidate of an abnormality cause metric based on correlation destruction detected by using the correlation model and measured values of the metrics, and
emphasize the candidate of the abnormality cause metric on the cluster.

17. The system analysis method according to claim 16, wherein
the one or more processors are configured to execute the instructions to:
change a configuration of the system to handle a failure relating to the abnormality cause metric of the system indicated in response to output of the display region.

18. The system analysis method according to claim 10, wherein
the metrics respectively indicate performances of computer resources in the system.

19. A system analysis method comprising:
storing, by a processor, a plurality of clusters of metrics respectively indicating performance of computer resources included in a system;
dividing, by the processor, a display region of a display device into n divided regions in such a way that an area of a divided region i ($1 \leq i \leq n$) is equal to or larger than an area of a divided region i+1;
allocating, by the processor, each cluster to the divided region i sequentially selected from i=1, in the decreasing order of the number of metrics contained in each of the clusters, in such a way that the number of the clusters allocated to the divided region i is equal to or less than the number of clusters allocated to the divided region i+1;
drawing, by the processor, the cluster allocated to the divided region i in the divided region i of the display device; and
changing, by the processor, a configuration of the system to handle a failure relating to a metric of the system indicated in response to output of the divided region i on which the allocated cluster is drawn.

* * * * *